United States Patent
Hoeppel et al.

(10) Patent No.: US 10,553,755 B2
(45) Date of Patent: Feb. 4, 2020

(54) METHOD FOR PRODUCING A PLURALITY OF SEMICONDUCTOR CHIPS HAVING RECESSES IN THE DEVICE LAYER

(71) Applicant: OSRAM Opto Semiconductors GmbH, Regensburg (DE)

(72) Inventors: Lutz Hoeppel, Alteglofsheim (DE); Attila Molnar, Gelugor (MY)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 11 days.

(21) Appl. No.: 15/745,940

(22) PCT Filed: Jul. 13, 2016

(86) PCT No.: PCT/EP2016/066626
§ 371 (c)(1),
(2) Date: Jan. 18, 2018

(87) PCT Pub. No.: WO2017/012945
PCT Pub. Date: Jan. 26, 2017

(65) Prior Publication Data
US 2018/0219127 A1    Aug. 2, 2018

(30) Foreign Application Priority Data
Jul. 20, 2015    (DE) ........................ 10 2015 111 721

(51) Int. Cl.
*H01L 33/22*    (2010.01)
*H01L 33/00*    (2010.01)
(Continued)

(52) U.S. Cl.
CPC ............ *H01L 33/22* (2013.01); *H01L 33/007* (2013.01); *H01L 33/0079* (2013.01);
(Continued)

(58) Field of Classification Search
CPC ....... H01L 29/34; H01L 33/22; H01L 33/007; H01L 33/0079; H01L 33/0095; H01L 33/32; H01L 33/382; H01L 33/44
See application file for complete search history.

(56) References Cited

U.S. PATENT DOCUMENTS

2010/0171135 A1 *   7/2010   Engl .................... H01L 33/382
                                                                                           257/98
2010/0258818 A1    10/2010   Lee et al.
(Continued)

FOREIGN PATENT DOCUMENTS

DE       10056999 A1    5/2001
DE       10232582 A1    4/2003
(Continued)

*Primary Examiner* — Michael Jung
(74) *Attorney, Agent, or Firm* — McDermott Will & Emery LLP (57) ABSTRACT

The invention relates, inter alia, to a method for producing a plurality of semiconductor chips, the method comprising the following steps: providing a substrate (1); applying a semiconductor layer sequence (2) to the substrate (1); generating a plurality of recesses (6) in the semiconductor layer sequence (2) on the side of the semiconductor layer sequence (2) that is facing away from the substrate (1); detaching the substrate (1) from the semiconductor layer sequence (2); thinning the semiconductor layer sequence (2) on the side that was facing the substrate (1) prior to detaching the substrate (1).

12 Claims, 4 Drawing Sheets (51) Int. Cl.
*H01L 33/38* (2010.01)
*H01L 33/44* (2010.01)
*H01L 33/32* (2010.01)

(52) U.S. Cl.
CPC .......... *H01L 33/0095* (2013.01); *H01L 33/32* (2013.01); *H01L 33/382* (2013.01); *H01L 33/44* (2013.01); *H01L 2933/0016* (2013.01); *H01L 2933/0025* (2013.01)

(56) References Cited

U.S. PATENT DOCUMENTS

| | | | |
|---|---|---|---|
| 2012/0086026 A1* | 4/2012 | Engl | ............... H01L 27/156 257/93 |
| 2012/0228670 A1 | 9/2012 | Saito | |
| 2013/0126925 A1 | 5/2013 | Shibata et al. | |
| 2013/0302926 A1 | 11/2013 | Chu et al. | |
| 2014/0367717 A1 | 12/2014 | Freund et al. | |

FOREIGN PATENT DOCUMENTS

| | | |
|---|---|---|
| DE | 102006046449 A1 | 5/2007 |
| DE | 102006037789 A1 | 2/2008 |
| DE | 102013103079 A1 | 10/2014 |
| DE | 102014115712 A1 | 4/2015 |
| WO | 2006/043796 A1 | 4/2006 |
| WO | 2010/036326 A1 | 4/2010 |
| WO | 2015/055346 A1 | 4/2015 |

\* cited by examiner

METHOD FOR PRODUCING A PLURALITY OF SEMICONDUCTOR CHIPS HAVING RECESSES IN THE DEVICE LAYER

CROSS-REFERENCE TO RELATED APPLICATIONS

This application is the U.S. National Phase under 35 U.S.C. § 371 of International Patent Application No. PCT/EP2016/066626, filed on Jul. 13, 2016, which in turn claims the benefit of German Application No. 10 2015 111 721.5, filed on Jul. 20, 2015, the entire disclosures of which Applications are incorporated by reference herein.

The publication WO 2010/036326 A1 describes a method for producing a semiconductor chip and a radiation-emitting semiconductor chip.

An objective is to provide a semiconductor chip which may be produced in a particularly cost-efficient way.

A further objective is to provide a method for producing such a semiconductor chip.

A method for producing a semiconductor chip, in particular a plurality of semiconductor chips is provided. In particular, the semiconductor chip may be an optoelectronic semiconductor chip. The semiconductor chip may also be configured as a radiation-emitting semiconductor chip, which emits electromagnetic radiation, for example light, during operation.

According to at least one embodiment of the method, at first a substrate is provided. The substrate may be a growth substrate, onto which semiconductor layers of the semiconductor chip may be deposited by an epitaxial process, for example. For example, the substrate may be formed at least in some places by a metal, a glass, a ceramic or a semiconductor material. In particular, the substrate may be a sapphire substrate, which includes sapphire or consists of sapphire. In addition, the substrate may be a silicon substrate, which includes silicon or consists of silicon.

According to at least one embodiment of the method, a semiconductor layer sequence is applied on the substrate. For example, the semiconductor layer sequence is deposited on the substrate by means of an epitaxial process. The semiconductor layer sequence may comprise a first region, which is n-doped, for example. The semiconductor layer sequence may further comprise an active region, in which electromagnetic radiation may be generated during operation, for example. In addition, the semiconductor layer sequence may comprise a second region that is p-doped, for example.

According to an embodiment of the method for producing a plurality of semiconductor chips, in a next step of the method a plurality of recesses is generated in the semiconductor layer sequence. The recesses in the semiconductor layer sequence may be generated by mechanical and/or chemical removal of material, for example. In particular, the recesses in the semiconductor layer sequence may be generated by etching, for example dry-chemical etching.

Thus, the recesses are in particular generated from the side of the semiconductor layer sequence facing away from the substrate. That is, the recesses then extend from the side of the semiconductor layer sequence facing away from the substrate towards the substrate.

According to at least one embodiment of the method, in a next step of the method the substrate is removed from the semiconductor layer sequence. The removal of the substrate may for example be performed by a laser detaching process, for example by laser lift off. In addition, the substrate may be removed by mechanical and/or chemical methods like polishing and/or etching.

According to at least one embodiment of the method, in a further step of the method a thinning of the semiconductor layer sequence is performed from the side facing the substrate before removing the substrate. That is, the thickness of the semiconductor layer sequence is reduced. The thickness of the semiconductor layer sequence is thus reduced for example in a vertical direction extending parallel to the growth direction or to the stacking direction of the semiconductor layer sequence. However, thinning of the semiconductor layer sequence does not have to be performed evenly, but the semiconductor layer sequence may be rather patterned during thinning, in particular roughened, thus a rough outer surface of the semiconductor layer sequence is generated on the side facing the substrate before removal.

Thinning of the semiconductor layer sequence may be performed by mechanical and/or chemical processes. In case the semiconductor layer sequence is a semiconductor layer sequence based on a nitride semiconductor compound material, for example, a GaN based semiconductor layer sequence, for example, thinning is performed by etching of the semiconductor layer sequence using KOH, for example.

According to at least one embodiment of the method for producing a plurality of semiconductor chips, the method comprises the following steps:
providing a substrate,
applying a semiconductor layer sequence on the substrate,
generating a plurality of recesses in the semiconductor layer sequence from the side of the semiconductor facing away from the substrate,
removing the substrate from the semiconductor layer sequence,
thinning of the semiconductor layer sequence from the side facing the substrate before detaching.

The method may in particular be performed in the specified order.

According to at least one embodiment of the method, the recesses do not completely penetrate the semiconductor layer sequence before thinning of the semiconductor layer sequence in each case, and after thinning of the semiconductor layer sequence the recesses penetrate the semiconductor layer sequence completely. That is, at least a majority of the recesses, in particular all recesses, are applied to the semiconductor layer sequence only to a depth that the semiconductor layer sequence is not completely penetrated by the recesses at any point. In this way, a residue of the material of the semiconductor layer sequence is left between the lowermost point of the recesses, as measured from the side of the semiconductor layer sequence facing away from the substrate, between the substrate and the lowermost point of the recesses, wherein the semiconductor layer sequence has a minimum thickness.

Preferably, the minimum thickness amounts to at least 0.1 μm and maximum 1.0 μm, in particular 0.5 μm. Such a residual material thickness of the semiconductor layer sequence has proven to be the optimum regarding a good separability of the semiconductor layer sequence, wherein the residual thickness has a size which allows to prevent damage of the substrate by the separation process.

In other words, the recesses are not formed too deep, thus no substrate is exposed on the bottom surface thereof. The semiconductor layer sequence is removed in the region of the recesses from the side facing away from the substrate up to such a depth of the recesses that a residual thickness of the semiconductor layer sequence is maintained between the lowermost point of the recesses and the substrate. After thinning, the recesses penetrate the semiconductor layer sequence in each case completely. That is, after thinning the semiconductor layer sequence is singulated, wherein the singulated regions of the semiconductor layer sequence are laterally delimited by the recesses and by material inserted into the recesses, where appropriate.

The method described here is, amongst others, based on the insight that by forming recesses in a depth that substrate is exposed on the bottom surface thereof, the surface of the substrate will be damaged in a way that cost-efficient processes may be required for a potential reuse of the substrate. Alternatively, also recesses may be formed, which in particular may be used to singulate the semiconductor layer sequence in separate semiconductor chips from the side originally facing the substrate, that is after removal of the substrate. However, in this case wet-chemical processes having quite high temperatures are required, which in particular require the usage of a photographic technique for patterning the chip grid. This is also disadvantageous compared to the method described here, where the recesses are generated on the side facing away from substrate in a depth that a residual thickness of the semiconductor layer sequence is maintained.

According to at least one embodiment of the method, the recesses are tapering towards the substrate before removal of the substrate. That is, in a cross-section view transverse or perpendicular to the vertical direction, the recesses have inclined inner surfaces, for example, which move towards each other in the direction of the substrate, thus the expansion of the recesses is smaller in a direction perpendicular to the vertical direction closer to the substrate than in a direction further away from the substrate. Thus, a region of the semiconductor layer sequence that is delimited by recesses expands towards the substrate.

According at least one embodiment of the method, the recesses are generated along a chip grid. That is, the recesses are for example generated along a plurality of parallel lines and along a plurality of lines extending perpendicular to those parallel lines in the main extension level of the semiconductor layer sequence, wherein a distance of adjacent parallel lines equals the chip grid. In particular, the recesses are used here to delimit the completed semiconductor chips laterally, that is, a singulation of the semiconductor layer sequence and of further components of the semiconductor chips is performed along the recesses. In particular, the recesses are thus not vias for electrically connecting a n-conducting or p-conducting region of the semiconductor chip to be produced, but material removals which serve to singulate the semiconductor layer sequence.

According to at least one embodiment of the method, thinning of the semiconductor layer sequence is performed by roughening the semiconductor layer sequence by means of which roughenings are generated on the side of the semiconductor layer sequence originally facing the substrate.

Due to the thinning of the semiconductor layer sequence, a residual material between the side of the semiconductor layer sequence originally facing the substrate and the recess is removed, and this way producing a roughening of the semiconductor layer sequence may be combined with the singulation of the semiconductor layer sequence in a single step of the method. By thinning, roughenings are thus generated which increase the probability that electromagnetic radiation is exiting from the semiconductor chip on the radiation exit side of the optoelectronic semiconductor chip to be produced, and the residual material of the semiconductor layer sequence, which has not penetrated the recesses, is removed. Generating roughenings and thus thinning may be performed by KOH etching without using a masking technique, for example, thus this production step may be performed in an especially simple and cost-efficient way.

According to at least one embodiment of the method, after generating the plurality of the recesses, an isolation layer sequence is generated, which covers the semiconductor layer sequence at the surfaces thereof facing the recesses. The isolation layer sequence is at least formed by one layer. At least one layer of the isolation layer sequence is formed as electrically isolating. The isolation layer sequence may for example comprise a layer on the side facing the semiconductor layer sequence, in particular directly adjacent to the semiconductor layer sequence, which is formed by silicon nitride or consists of silicon nitride. Upon this layer a silicon dioxide layer may be applied on the side of the silicon nitride layer facing away of the semiconductor layer sequence. Alternatively or in addition, the isolation layer sequence may at least comprise a reflecting layer, which is formed using a metal like aluminum, rhodium, and/or silver, for example. Alternatively or in addition it is also possible to form the isolation layer sequence at least in part as a dielectric mirror or distributed Bragg reflector, for example as sequence of layers having high and low refractive indices.

According to at least one embodiment of the method, the isolation layer sequence will be exposed during thinning of the semiconductor layer sequence in some places. That is, after thinning the semiconductor layer sequence, the isolation layer sequence may form an outer surface in some places of the semiconductor chip produced using this method. In this case, the isolation layer sequence preferably includes a layer formed using silicon nitride, which for example is not or only to a minimum extent affected by a KOH etching process.

According to at least one embodiment of the method, a carrier is formed on the side of the semiconductor layer sequence facing away from the substrate before removing the substrate. The carrier is to mechanically support the semiconductor layer sequence after removal of the substrate. Furthermore, the carrier may be a connection carrier by means of which the completed semiconductor chips may be contacted in an electrically conductive way. According to at least one embodiment of the method, hereto the carrier may include a plurality of first contactings, plurality of second contactings and a shaped body, wherein the shaped body surrounds the contactings laterally thereof. In other words, the contactings are embedded in the shaped body, for example. The shaped body may for example be formed by using an electrically isolating material, like a plastic material, a silicon and/or an epoxy resin, for example. The contactings may be formed in the recesses of the shaped body by electroplating, for example.

According to at least one embodiment of the method, the shaped body extends into the plurality of recesses and fills them at least in some places. That is, after forming the isolation layer sequence in the recesses, material of the shaped body may be filled into the recesses during forming of the shaped body, for example. The recesses may then be covered in a conformed manner on the side facing the semiconductor body by the isolation layer sequence and may also be filled with the material of the shaped body. This is advantageous in that the shaped body and thus a part of the carrier is connected to the semiconductor layer sequence in a particular stable way, as the shaped body and thus a part of the carrier protrudes in the region of the recesses in the semiconductor layer sequence. In other words, the carrier is thus especially well anchored in the semiconductor layer sequence.

According to at least one embodiment of the method, a singulation in a plurality of semiconductor chips is performed along separation lines, wherein at least some of the separation lines extend through a recess and the shaped body, wherein each singulated semiconductor chip is assigned at least one first contacting and at least one second contacting. As already stated above, the recesses may be formed along chip grids and thus support the singulation of the semiconductor layer sequence during singulation into separate semiconductor chips. Said singulation may for example be performed by sewing or laser cutting along the recesses through the recesses and the carrier, thus each of the semiconductor chips includes one part of the semiconductor layer sequence, which is delimited by the recesses on four sides, for example.

Thus, each semiconductor chip is assigned at least one first contacting and at least one second contacting, wherein in particular each semiconductor chip may comprise exactly one first contacting and exactly one second contacting, which are configured for an n- or p-side contacting of the semiconductor chip. This way, a surface mountable semiconductor chip is produced.

The method described here is characterized by a good reusability of the growth substrate, amongst others, as in a first step the semiconductor layer sequence is not separated completely when generating the recesses, thus the growth substrate is not damaged by generating the recesses, and the semiconductor layer sequence is finally cut completely in a second step, the thinning of the semiconductor layer sequence, after the substrate has been removed. No etching mask has to be created for this second step, which is performed at the n-side of the semiconductor layer sequence, for example, so that this step may be performed in a particularly cost-efficient way.

Further, a radiation-emitting semiconductor chip is provided. The radiation-emitting semiconductor chip may in particular be produced by a method described here, thus all of the features disclosed for the semiconductor chip are also disclosed for the method and vice versa.

The radiation-emitting semiconductor chip is in particular a surface mountable semiconductor chip, wherein contactings to the n- and to the p-side contactings are accessible on a lower surface of the semiconductor chip.

According to at least one embodiment of the radiation-emitting semiconductor chip, the radiation-emitting semiconductor chip includes a semiconductor layer sequence having an active region, in which electromagnetic radiation is generated during operation of the semiconductor chip, and a radiation exit surface, where the electromagnetic radiation, which is generated in the active region, exits at least in part. Thus, a side surface of the semiconductor layer sequence towards the radiation exit side at first includes a first angle in a vertical direction having a value higher than 90°, and further along the side surface towards the radiation exit side a second angle in the vertical direction having a value smaller than 90°. The vertical direction is a direction which is parallel to the growth direction and/or stacking direction of the semiconductor layer sequence, for example. In other words, the semiconductor body of the radiation-emitting semiconductor chip at first extends in an expanding shape towards the radiation exit side and then tapers towards the radiation exit side.

Such a design of the semiconductor layer sequence may for example be achieved by the two-step separation process described here, wherein at first the recesses in the semiconductor layer sequence along which the semiconductor layer sequence will be singulated do not completely extend through the semiconductor layer sequence. If in this case the recesses are formed as tapering towards the substrate of the semiconductor layer sequence, then the semiconductor layer sequence includes an expanding shape towards the substrate in this region in the completed semiconductor chip, and thus towards the radiation exit side. A complete separation of the semiconductor layer sequence will then be performed in a second step, the thinning of the semiconductor layer sequence. Here, the portion of the semiconductor layer sequence is generated, which then tapers towards the initially existing substrate and thus towards the radiation exit side.

The side surface of the semiconductor layer sequence is the outer surface of the semiconductor layer sequence which connects the cover surface of the semiconductor layer sequence on the radiation exit side to the bottom surface of the semiconductor layer sequence on the opposite side. The outer surface abuts largely or completely on the recess and thus for example on an isolation layer sequence which has been created during the production process on an inner surface of the recess, for example.

According to at least one embodiment of the radiation-emitting semiconductor chip, the side surface includes the second smaller angle in the region of a roughening of the semiconductor layer sequence. That is, in the region, where the semiconductor layer sequence has been thinned by roughening, for example, the semiconductor layer sequence comprises a second smaller angle in the completed radiation-emitting semiconductor chip, so that in this region the semiconductor layer sequence tapers towards the radiation exit surface.

According to at least one embodiment of the radiation emitting semiconductor chip, at least in some places the side surface is covered by an isolation layer sequence, which abuts on a shaped body and/or a metal layer sequence on the side facing away from the semiconductor layer sequence. That is, the side surface is partly or completely covered by the isolation layer sequence which has been applied on the inner surface of the recesses during the production process. Depending on the material the recesses have been filled with, the isolation layer sequence abuts on the shaped body of the carrier of the semiconductor chip and/or a metal layer sequence, for example, which may be a metal layer sequence, for example, which serves to strengthen the semiconductor layer sequence mechanically.

In particular, the isolation layer sequence and/or the shaped body and/or the metal layer sequence may be formed as reflective for the electromagnetic radiation generated in the active region. In this case, the extension of the side surface as described here is especially advantageous. The material delimiting the side surface thus forms a reflector in the region, where the semiconductor body expands towards the radiation exit side, which directs the electromagnetic radiation, which impinges on it, towards the radiation exit side. In the upper region of the semiconductor layer sequence adjacent to the radiation exit side, the semiconductor body is tapering in some places towards the radiation exit side, which reduces the probability of a total reflection during radiation exit, and thus increases the intensity of the radiation emitted during operation of the semiconductor chip.

According to at least one embodiment of the radiation-emitting semiconductor chip, the semiconductor layer sequence projects from the isolation layer sequence at least in the region of the roughening in the vertical direction. That is, the semiconductor layer sequence projects at the radiation exit side in a vertical direction beyond the isolation layer sequence and thus for example also beyond the shaped body and/or the metal layer sequence. This results in a particular unrestricted exit of electromagnetic radiation on the radiation exit side, for example through the roughenings, which further increases the intensity of the exiting electromagnetic radiation.

BRIEF DESCRIPTION OF THE FIGURES:

The method described here and the semiconductor chip described here will be explained in more detail in the following by means of exemplary embodiments and the corresponding figures.

Identical, similar elements or elements seemingly identical are indicated by the same reference numerals in the figures. The figures and the dimensions of the elements displayed in the figures are not intended to be true to scale. The single elements may be rather shown in a larger size to enhance visibility and/or understanding.

FIGS. 1A to 1F describe an exemplary embodiment of the method described here by using schematic section views.

Figure 1A:
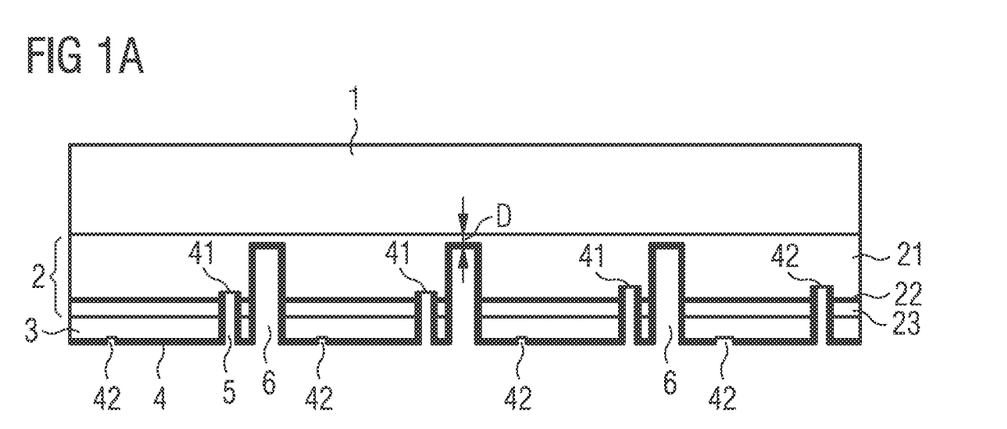
With reference to FIGS. 1A, 1B, 1C, 1D, 1E, 1F, an exemplary embodiment of the method described here is explained in more detail.

Reference is made to FIG. 1A, which schematically illustrates that at first a growth substrate 1 is provided. The growth substrate 1 may for example be sapphire substrate. A semiconductor layer sequence 2 is deposited on the growth substrate 1 by using an epitaxial process, for example, the semiconductor layer sequence 2 is based on GaN, for example. The semiconductor layer 2 includes a first region 21, which is formed as n-conducting, for example, and an active region 22, where an electromagnetic radiation may be generated during operation, and a second region 23, which is formed as p-conducting, for example.

On the side of the semiconductor layer sequence 2 facing away from the substrate 1 a first metal layer sequence 3 may be formed, which at least includes one layer that is formed by a metal or which includes a metal. The first metal layer sequence 3 may include a reflecting metal, like silver, for example.

In a next step of the method, which is also described referring to FIG. 1A, vias 5 and recesses 6 are generated. The vias 5 extend through the first metal layer sequence 3, the second region 23, the active region 22 into the first region 21. In the completed semiconductor chip, these vias 5 provide an n-side contacting of the semiconductor chip.

The recesses 6 also extend in the first region 21, however the recesses 6 extend deeper into the first region 21 than the vias 5, and the recesses 6 are formed with a larger width in the illustrated cross-section of the semiconductor layer sequence. The depth of the recesses 6 amounts from at least 4 µm to maximum 5 µm, for example. The minimum width of the recesses amounts from at least 20 µm to maximum 25 µm, in particular 25 µm, for example.

Here, the recesses 6 do not completely penetrate the semiconductor layer sequence 2, but a region of the semiconductor layer sequence having a residual thickness D remains, due to which the recesses 6 are spaced apart from the substrate 1.

In a further step of the method, an isolation layer sequence 4 is formed on the side facing away from the substrate, which may for example be generated by using an ALD and/or CVD process. The isolation layer sequence 4 comprises for example a silicon nitride layer, which directly abuts on the first metal layer sequence 3 and the semiconductor body 2. In addition, the isolation layer sequence 4 may comprise additional semiconductor layers and/or metal layers, and may be formed as reflecting, for example. The isolation layer sequence 4 includes first holes 41 in the region of the vias 5, where the first region 21 of the semiconductor layer sequence 2 may be accessed. In addition, the isolation layer sequence 4 includes second holes 42, in which the first metal layer sequence 3 is freely accessible. Said holes 41, 42 allow the n- and/or p-side contacting of the semiconductor chip in the completed semiconductor chip.

Figure 1B:
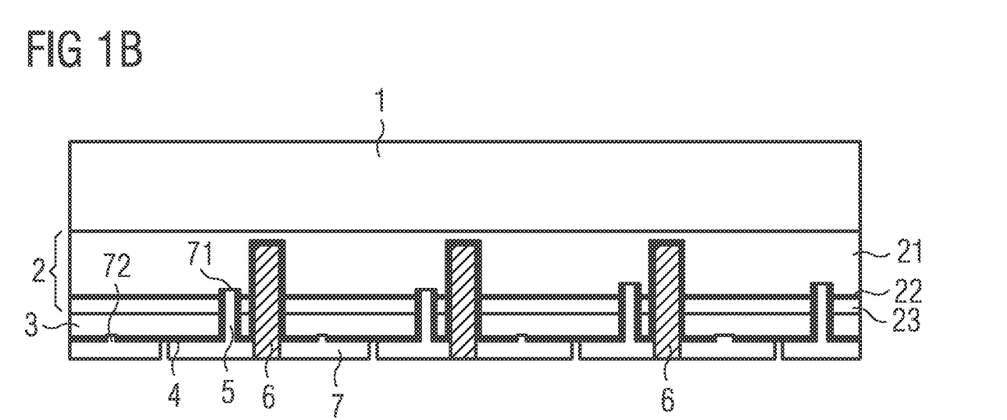

In a further step of the method, FIG. 1B, a second metal layer sequence 7 is deposited on the isolation layer sequence 4. The metal layer sequence 7 contacts the first metal layer sequence 3 in the region of the second vias 42 and forms second contacts 72 here. In the region of the vias 5, the second metal layer sequence 7 contacts the first region 21 of the semiconductor layer sequence 2 for n-side contacting of the first contacts 71.

The second metal layer sequence 7 may have a mechanically enforcing function for the semiconductor body. In addition, the second metal layer sequence 7 may at least include a layer which functions as seed layer in order to produce contactings later in the method. The second metal layer sequence 7 may for example be formed by metals, like nickel and/or copper.

In FIG. 1B is shown that the recesses 6 may either be filled with material of the second metal layer sequence 7, or there is no material of the metal layer sequence left.

Figure 1C:
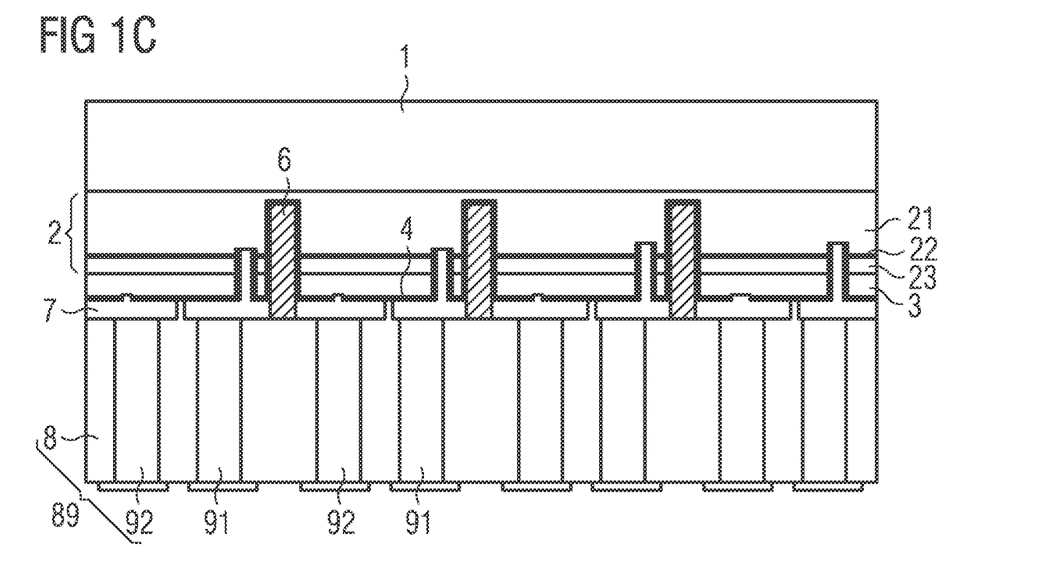

In the next step of the method, FIG. 1C, the carrier 89 is created. Hereto, for example, the shaped body 8 is generated on the lower side facing away from the substrate, wherein the shaped body 8 abuts in some places directly on the first metal layer sequence 3 and the second metal layer sequence 7. The shaped body 8 is formed of an electrically isolating material, for example an epoxy resin.

In the shaped body 8 recesses are created or released, which are filled by using material of the first contactings 91 and second contactings 92, for example by electroplating. Here, the second metal layer sequence 7 may function as seed layer for the contactings 91, 92 in some places. In particular, during application of the shaped body 8, it may be inserted into the recesses 6, thus they are filled with material of the shaped body 8.

Figure 1D:
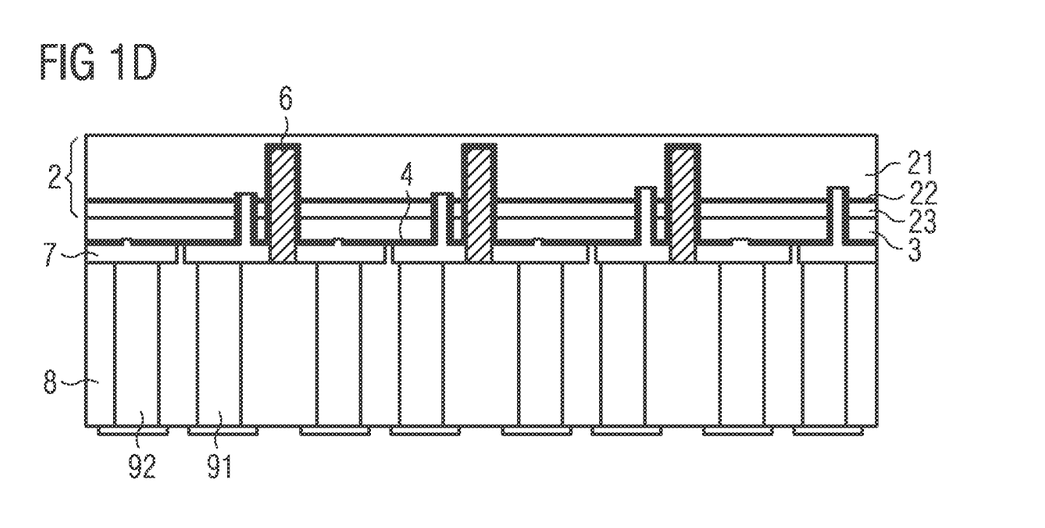

In the step of the method described referring to FIG. 1D, the growth substrate 1 is removed from the semiconductor layer sequence 2 by a laser lift-off process, for example.

Figure 1E:
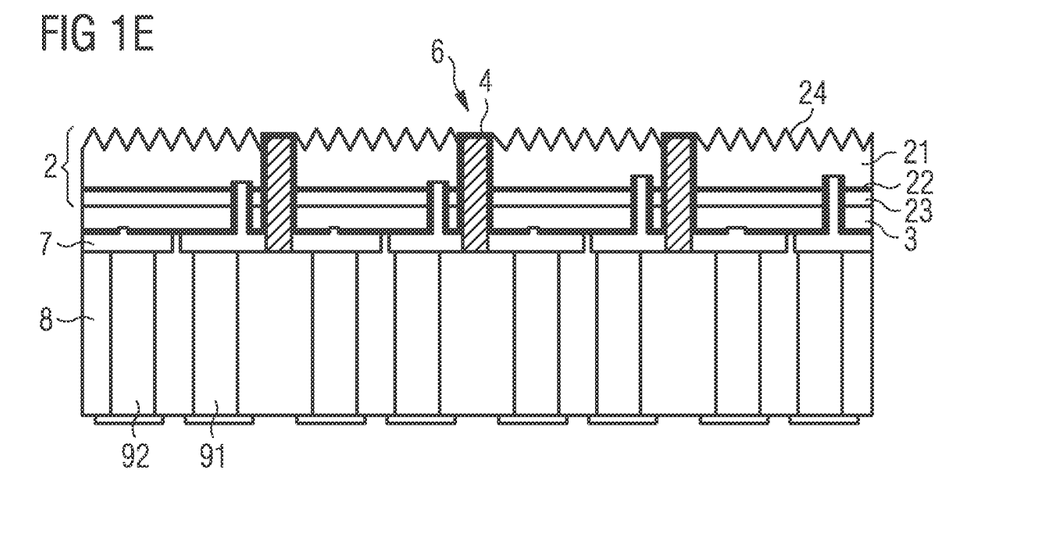

In the next step of the method, FIG. 1E, the thinning of the semiconductor layer sequence 2 by KOH etching is performed, thus roughenings 24 of the semiconductor layer sequence 2 are generated on the side facing away from the carrier 89. In addition, the semiconductor layer sequence 2 is thinned in a way that the recesses 6 and along with them the isolation layer 4 and/or the shaped body 8 and/or the second metal layer sequence 7 are exposed, for example.

Figure 1F:
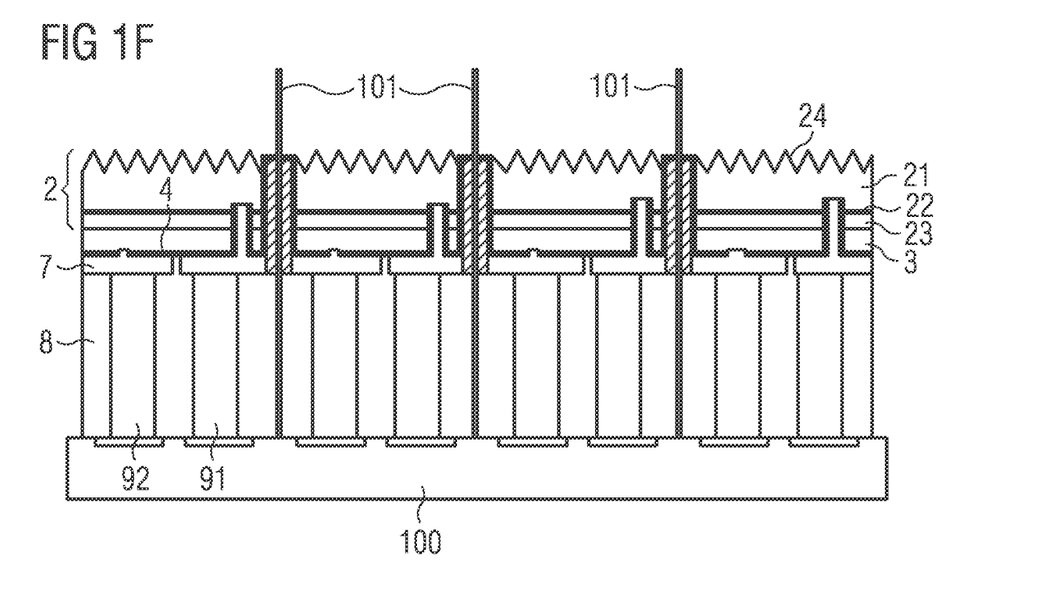

In the last step of the method, FIG. 1F, a singulation in separate semiconductor chips along the separation lines 101 is performed, which extend through the recesses and the carrier 89. Here, the composition consisting of semiconductor layer sequence 2, metal layer sequences 3, 7, and carrier 89 may be attached on an auxiliary carrier.

However, it is not shown in the FIGS. 1A to 1F, that the recesses preferably taper in a direction facing away from the carrier 89, thus the semiconductor layer sequence 2 expands in the direction of the roughenings 24 and thus towards the radiation exit side 2a.

Figure 2A:
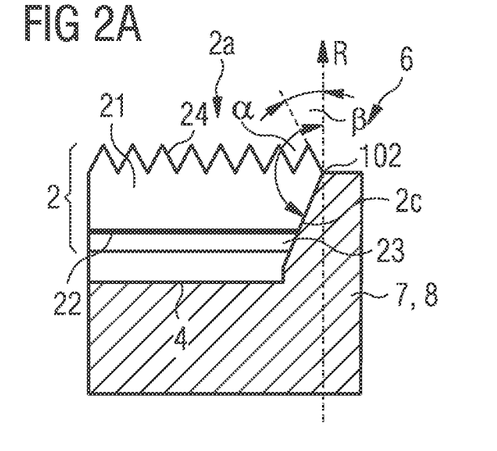
With reference to FIGS. 2A, 2B, 2C, exemplary embodiments of the radiation emitting semiconductor chips described here are explained in more detail.
Figure 2B:
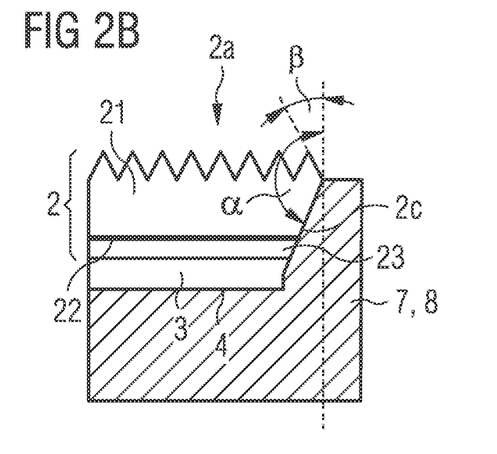
Figure 2C:
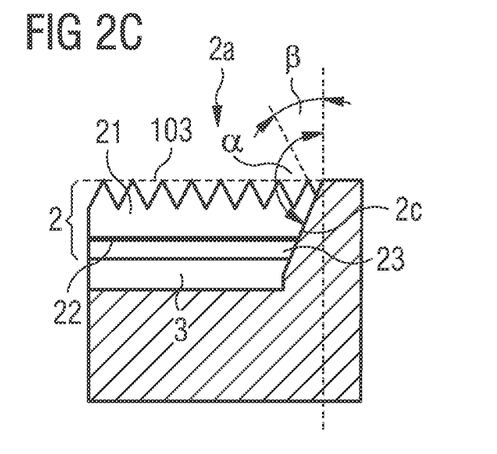

This is shown in detail in the FIGS. 2A to 2C. Here section views of exemplary embodiments of the radiation-emitting semiconductor chip described here are shown, which includes the semiconductor layer sequence 2. The semiconductor layer sequence 2 includes the active region 22, in which electromagnetic radiation is generated during operation of the semiconductor chip, which exits at least in parts on the radiation exit side, which includes the roughenings 24. The semiconductor layer sequence further comprises a side surface 2c, which at first includes a first angle α in the vertical direction R towards the radiation exit side 2a having a which value higher than 90°, and further along the side surface towards the radiation exit side 2a an angle ß in the vertical direction R having a value smaller than 90°.

In the exemplary embodiment of FIG. 2A it is thus shown, that the isolation layer sequence 4 will not be damaged during thinning of the semiconductor layer sequence 2, as it is formed using SiNx, for example, which forms an etching step for KOH etching. That is, the isolation layer sequence 4 remains unchanged, and the flanks of the semiconductor layer 2 sequence having different directions coincide at contact point 102. Generally, in this exemplary embodiment the semiconductor layer sequence 2 projects beyond the isolation layer sequence and the filling of the recesses 6 at least in the region of the roughenings 24.

This is also true for the exemplary embodiment of FIG. 2B, where the isolation layer sequence 4 is partly removed by thinning of the semiconductor layer sequence, thus underlying materials become exposed. This may cause the isolation layer sequence 4 to decrease, thus a gap exists between the filling of the recess 6, like for example, the shaped body 8 or the second metal layer sequence 7 and the semiconductor body 2.

In the exemplary embodiment of FIG. 2C, the semiconductor layer sequence is arranged on the radiation exit surface 2a thereof completely underneath the filling of the recess and the isolation layer sequence 4. That is, in this exemplary embodiment, the semiconductor layer sequence 2 has been thinned to a particular high depth. This way, the filling of the recess may for example be a mechanical protection of the semiconductor layer sequence 2, however the optical characteristics of such a radiation-emitting semiconductor chip are deteriorated.

The invention shall not be limited by the description of the exemplary embodiments. Rather, the invention comprises any new feature and any combination of features, which in particular includes any combination of features in the claims, even if this feature or this combination is not be explicitly specified in the claims or in exemplary embodiments.

Priority is claimed of the German application 102015111721.5, the disclosure of which is included by reference.

LIST OF REFERENCE NUMERALS

1 Substrate
2 Semiconductor layer sequence
2a Radiation exit side
2c Side surface
21 First region
22 Active region
23 Second region
24 Roughening
3 First metal layer sequence
4 Isolation layer sequence
41 First hole
42 Second hole
5 Via
6 Recess
7 Second metal layer sequence
71 First contact
72 Second contact
8 Shaped body
89 Carrier
91 First contacting
92 Second contacting
100 Auxiliary carrier
101 Separation line
102 Contact point
103 Auxiliary line
α First angle
ß Second angle
D Minimum thickness
R Vertical direction

The invention claimed is:
1. Method for producing a plurality of semiconductor chips comprising the following steps:
   providing a substrate,
   applying a semiconductor layer sequence on the substrate,
   generating a plurality of recesses in the semiconductor layer sequence from the side of the semiconductor layer sequence facing away from the substrate,
   removing the substrate from the semiconductor layer sequence,
   thinning the semiconductor layer sequence from the side facing the substrate before removal of the substrate,
   wherein the recesses do not completely penetrate the semiconductor layer sequence before thinning of the semiconductor layer sequence respectively, and the recesses penetrate the semiconductor layer sequence completely after thinning of the semiconductor layer sequence, respectively, and
   wherein the semiconductor layer sequence is a radiation-emitting semiconductor layer sequence or a nitride semiconductor layer sequence.
2. Method according to claim 1,
   wherein before thinning of the semiconductor layer sequence a residue of the material of the semiconductor layer sequence remains between the lowermost point of the recesses and the substrate, so that the semiconductor layer sequence has a minimum thickness (D).
3. Method according to claim 1,
   wherein the recesses are tapering towards the substrate before removal of the substrate.
4. Method according to claim 1,
   wherein the recesses are generated along a chip grid.
5. Method according to claim 1, wherein the thinning of the semiconductor layer sequence is performed by roughening the semiconductor layer sequence, by means of which roughenings are generated on the side of the semiconductor layer sequence originally facing the substrate.
6. Method according to claim 1,
   wherein after generating the plurality of the recesses an isolation layer sequence is generated, the isolation layer sequence covering the semiconductor layer sequence on surfaces facing the recesses.

7. Method according to claim 6,
wherein during thinning of the semiconductor layer sequence the isolation layer sequence is exposed in some places.

8. Method according to claim 1,
wherein a carrier is generated on the side of the semiconductor layer sequence facing away from the substrate before removing the substrate, wherein the carrier includes a plurality of first contactings, a plurality of second contactings, and the shaped body, wherein the shaped body surrounds the contactings laterally.

9. Method according to claim 8,
wherein the shaped body extends in the plurality of recesses and fills them at least in some places.

10. Method according to claim 8,
wherein a singulation is performed in a plurality of semiconductor chips along separation lines, wherein at least some of the separation lines extend through a recess and the shaped body,
wherein each singulated semiconductor chip is assigned at least one first contacting and at least one second contacting.

11. Method for producing a plurality of semiconductor chips comprising the following steps:
providing a substrate,
applying a semiconductor layer sequence on the substrate,
generating a plurality of recesses in the semiconductor layer sequence from the side of the semiconductor layer sequence facing away from the substrate,
removing the substrate from the semiconductor layer sequence,
thinning the semiconductor layer sequence from the side facing the substrate before removal of the substrate,
wherein before thinning of the semiconductor layer sequence a residue of the material of the semiconductor layer sequence remains between the lowermost point of the recesses and the substrate, so that the semiconductor layer sequence has a minimum thickness (D), and
wherein the semiconductor layer sequence is a radiation-emitting semiconductor layer sequence or a nitride semiconductor layer sequence.

12. Method for producing a plurality of semiconductor chips comprising the following steps:
providing a substrate,
applying a semiconductor layer sequence on the substrate,
generating a plurality of recesses in the semiconductor layer sequence from the side of the semiconductor layer sequence facing away from the substrate,
removing the substrate from the semiconductor layer sequence,
thinning the semiconductor layer sequence from the side facing the substrate before removal of the substrate,
wherein a carrier is generated on the side of the semiconductor layer sequence facing away from the substrate before removing the substrate, wherein the carrier includes a plurality of first contactings, a plurality of second contactings, and the shaped body, wherein the shaped body surrounds the contactings laterally, and
wherein the semiconductor layer sequence is a radiation-emitting semiconductor layer sequence or a nitride semiconductor layer sequence.

* * * * *